(12) United States Patent
Miller et al.

(10) Patent No.: US 6,362,770 B1
(45) Date of Patent: Mar. 26, 2002

(54) DUAL INPUT SWITCHED CAPACITOR GAIN STAGE

(75) Inventors: Ira G. Miller, Tempe; Douglas A. Garrity, Gilbert; Thierry Cassagnes, Chandler, all of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/659,972

(22) Filed: Sep. 12, 2000

(51) Int. Cl.[7] ................................................. H03M 1/00
(52) U.S. Cl. ......................... 341/172; 341/141; 327/96; 327/553
(58) Field of Search ................................ 341/141, 172, 341/143; 327/96, 554, 563

(56) References Cited

U.S. PATENT DOCUMENTS

| | | | |
|---|---|---|---|
| 5,392,043 A | * 2/1995 | Ribner | 341/143 |
| 5,574,457 A | 11/1996 | Garrity et al. | 341/172 |
| 5,644,313 A | 7/1997 | Rakers et al. | 341/163 |
| 5,724,000 A | * 3/1998 | Quinn | 327/554 |
| 5,818,276 A | 10/1998 | Garrity et al. | 327/259 |

* cited by examiner

Primary Examiner—Howard L. Williams
(74) Attorney, Agent, or Firm—Mark J. Fink

(57) ABSTRACT

A gain stage using switched capacitor architecture and suitable for a pipelined analog to digital converters provides for three pairs of switched capacitor banks whose use may be alternated so as to provide simultaneous sampling of two input channels for sequential gain operation without the interposition of additional circuitry in the signal chain from input to output of the gain stage.

22 Claims, 4 Drawing Sheets

*-PRIOR ART-*

*-PRIOR ART-*

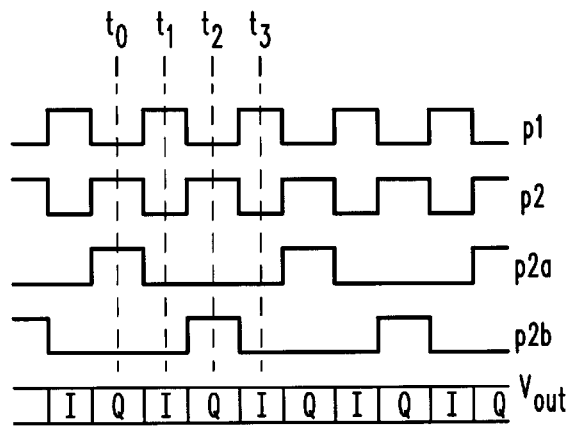
FIG. 8
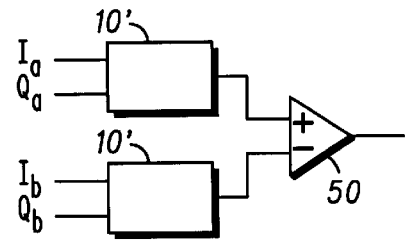
FIG. 9
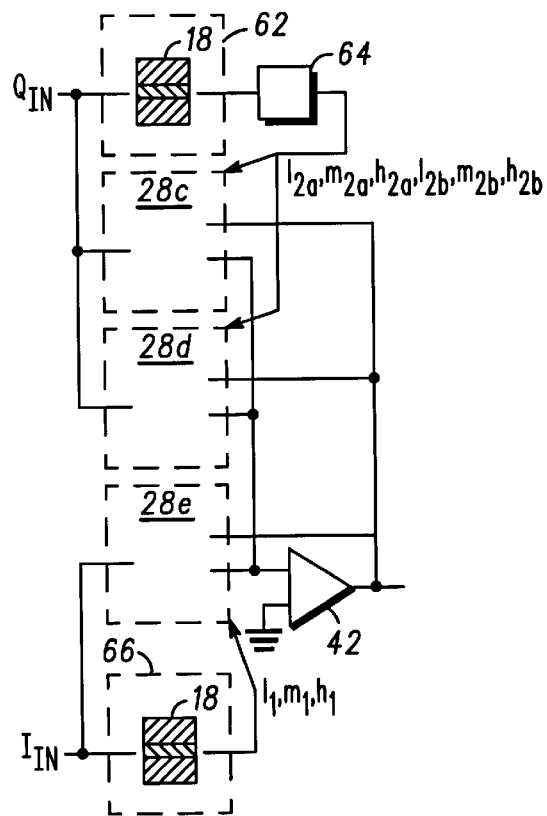
FIG. 7B
FIG. 10
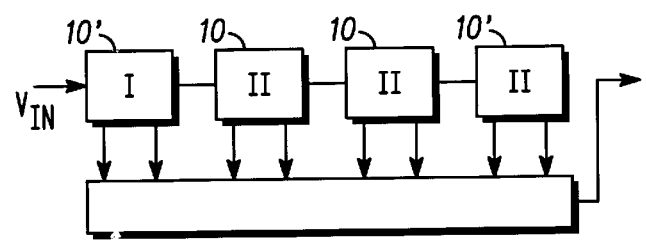
FIG. 11

US 6,362,770 B1

DUAL INPUT SWITCHED CAPACITOR GAIN STAGE

FIELD OF THE INVENTION

The invention relates generally to switched capacitor gain stages, such as are used in pipelined analog digital converters and, in particular, to a gain stage providing dual input capabilities.

BACKGROUND OF THE INVENTION

Switched capacitor gain stages provide precisely defined gains determined by a ratio in values between closely matched capacitors, typically on a single integrated circuit.

In one type of capacitor gain stage, a pair of capacitors is charged in parallel across an input voltage and a ground reference. The capacitor terminals that are attached to the ground reference are then moved to the inverting input of an operational amplifier while one of the capacitor terminals previously attached to the input voltage is moved to the output of the amplifier and the other capacitor terminal previously attached to the input voltage is attached to a reference voltage. When the capacitors have the same value, the output of the amplifier will then be twice the input voltage plus the reference voltage, the latter which may be negative to provide for effective subtractions as well as additions. In order to increase the throughput of the gain stage, two sets of capacitor pairs may be used with one charging from the input voltage while the other is connected to the amplifier to produce an output value.

A rapid and precise "pipelined" analog to digital converter (AC) can be created by connecting a number of these equal capacitor gain stages in series. The first gain stage receives the voltage to be converted and outputs a voltage to the next gain stage for its input, and so forth. Each gain stage doubles the input voltage, then adds a positive voltage reference $(+V_{ref})$, a negative voltage reference $(-V_{ref})$, or zero, as determined by a comparison of the input voltage with two thresholds $V_h$ and $V_1$. Each gain stage also produces two conversion bits dependent on the thresholds process and these are combined to produce the resultant digital conversion value.

The operation and architecture of pipeline AC is also generally described in "A 12-bit 1-Msample/s Capacitor Error-Averaging Pipeline A/D Converter" by Bang-Sup Song, Michael F. Tempest, and Kadabar R. Lakshmikumar in the IEEE Journal of Solid-State Circuits, Vol. 23, No. 6, December 1988, pp. 1324–1333, hereby incorporated by reference. A gain stage suitable for use in such an ADC is described in U.S. Pat. No. 5,574,457 entitled: Switched Capacitor Gain Stage, issued Jun. 12, 1995, assigned to the same assignee as the present invention and hereby incorporated by reference.

Frequently there is a need to simultaneously convert two analog signals into their digital values, for example, in electronic systems having an "in-phase" and "quadrature" signal. Such conversions may be accomplished through the use of two ADCs but at a considerable cost and power penalty.

An alternative approach is to position two sample and hold circuits in front of a single ADC. The sample and hold circuits may simultaneously sample the two input values to be presented in an interleaved sequence to a single analog to digital converter for conversion.

A drawback to this latter approach is that it introduces additional circuitry stage between the input signal and analog converter such as may add noise or systematic errors to the digital value. Further, the buffer amplifiers, timing circuitry for the interleaving, and other circuitry required by the sample and hold circuits significantly increase the cost of the analog to digital converter.

BRIEF SUMMARY OF THE INVENTION

The present invention provides a gain stage adapted to receive two input signals for simultaneous sampling and suitable for use with a pipelined ADC. Significantly, the gain stage of the present invention has significantly fewer parts than would be required with two sample and hold circuits and further, eliminates the introduction of additional circuitry between the input signals and the point of conversion to a digital signal because the gain stage performs both a sample and hold function and a most significant bit extraction.

Generally, the present invention realizes these advantages by using three sets of capacitor pairs. A first and second capacitor pair sample the two input signals while the third is connected across an amplifier. In a next clock cycle, the first capacitor pair is connected across the amplifier and then in a third clock cycle, the first and third capacitor pairs sample the dual inputs while the second capacitor pair is connected across the amplifier. In this way, simultaneous sampling of dual inputs can be obtained with no additional circuitry being introduced in the signal chain between the input signal and the final converted value.

Specifically, the present invention provides a switched capacitor gain stage having a first and second input and an output and including an amplifier having an output connected to the output of the gain stage, and further including a first, second and third capacitor pair. A switch network operates at a first time to switch the first capacitor pair and the second capacitor pair to receive varying voltage from the first and second inputs, respectively, and switch the third capacitor pair across the amplifier and a reference voltage to provide an amplifier output voltage equal to a gain factor times the voltage previously received on the third capacitor pair plus the reference voltage. At a second time after the first time, the switch network switches the first capacitor pair across the amplifier and a reference voltage to provide an amplifier output voltage equal to the gain factor times the voltage previously received on the first capacitor pair plus the reference voltage. At a third time after the second time, the switch network switches the first capacitor pair and the third capacitor pair to receive varying voltages from the first and second inputs, respectively, and switches the second capacitor pair across the amplifier and a reference voltage to provide an amplifier output voltage equal to the gain factor times the voltage previously received on the second capacitor pair plus the reference voltage.

Thus the invention provides a gain stage that may simultaneously sample two input signals for amplification without the introduction of additional circuitry between the input signals and the output of the gain stage. The cycling through of three capacitor pairs allows the same capacitors used for amplification to temporarily store input values for processing.

The invention may provide for simultaneous sampling of two input signals for processing by the gain stage without the duplication of all gain stage elements. By accepting a slightly lower throughput, the present invention provides simultaneous dual input sampling with only a single additional capacitor pair and associated switching circuitry over a dual phase, single channel ADC of the prior art.

The first, second and third capacitor pairs may be matched capacitors on a single integrated circuit.

Thus the invention provides for a dual input gain stage suitable for practical construction on a single integrated circuit. The design's use of standard switched capacitor techniques renders it ideal for integrated circuit implementation.

The present invention may be used in a pipelined dual input ADC in which a plurality of series coupled switched capacitor gain stages are used and the first switched capacitor gain stage has three switched capacitor pairs and alternate simultaneous independent sampling of the dual inputs with the first and second capacitor pairs and the first and third capacitor pairs and sequentially outputs a first output using the first capacitor pair, a second output using the second capacitor pair and a third output using the first capacitor pair and a fourth output using the third capacitor pair.

Thus the invention provides a dual input ADC that requires only modification of the initial gain stage for simultaneous sampling. After the first gain stage, the input values are multiplexed in time to be handled by a slightly modified dual phase ADC gain stage.

The foregoing and other advantages of the invention will appear from the following description. In this description, reference is made to the accompanying drawings, which form a part hereof, and in which there is shown by way of illustration, a preferred embodiment of the invention. Such embodiment and its particular objects and advantages do not define the scope of the invention, however, and reference must be made therefore to the claims for interpreting the scope of the invention.

BRIEF DESCRIPTION OF THE DRAWINGS

FIG. 7b is a schematic diagram similar to FIG. 7a showing the addition of range comparison circuitry and a delay circuit for the timing signals of one of the dual inputs signals;

FIG. 8 is a figure similar to that of FIG. 4 showing the clock signals needed for the gain stage of FIG. 7a and showing the time multiplexed output signals;

FIG. 9 is a block diagram showing implementation of symmetric circuits per FIG. 7a for the creation of a differential pipelined ADC;

FIG. 10 is a chart showing the interleaving of samplings through the three banks of switched capacitors of FIG. 7a at different times to provide alternate channel conversions at the output of the amplifier of FIG. 7a; and FIG. 11 is a block diagram showing the assembly of the gain stage of FIG. 7a together with gain stages of FIG. 3 (as modified to provide for separate I and Q inputs) for the creation of a pipelined ADC having dual input capabilities.

DETAILED DESCRIPTION OF THE PREFERRED EMBODIMENT

Figure 1:
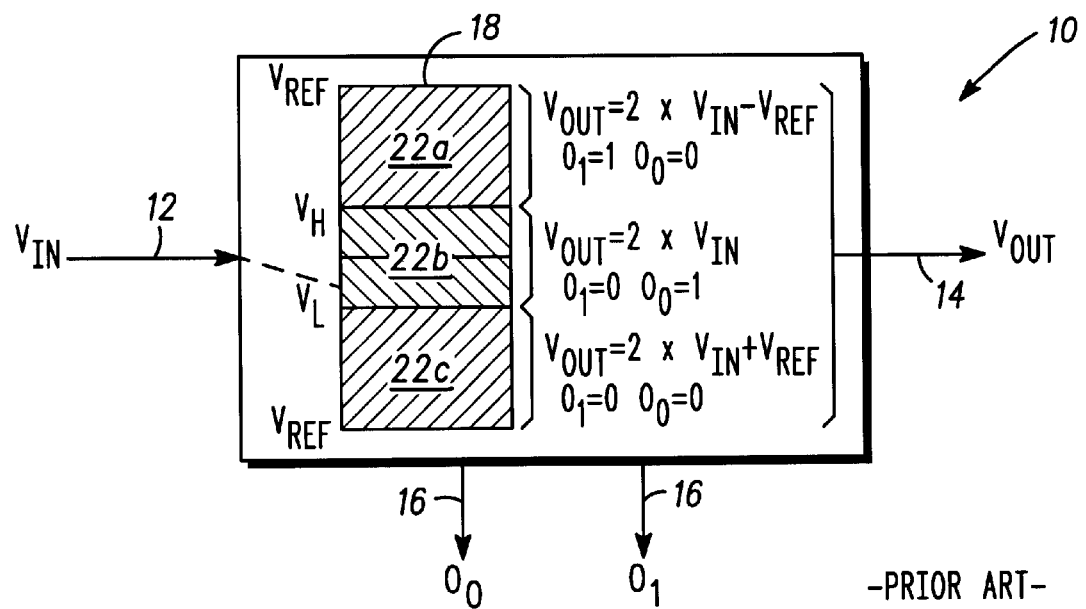
FIG. 1 is a functional block diagram of a gain stage used in a prior art pipelined ADC.

Referring now to FIG. 1, a gain stage 10, including the necessary circuitry for production of a pipelined ADC, receives an input voltage 12 ($V_{in}$) to produce an output voltage 14 ($V_{out}$) and two conversion bits 16 ($O_1$ and $O_0$) used for generation of a digital value in the ADC.

As is understood in the prior art, gain stage 10 compares the input voltage 12 against an input range 18 spanning values between $-V_{ref}$ and $+V_{ref}$ where $V_{ref}$ is an arbitrary reference voltage. High and low threshold values $V_h$ and $V_1$ may be defined about the midpoint 20 of the range 18 where $V_h$ can take any value between the midpoint and $V_{ref}/2$ and $V_1$ can take any value between $-V_{ref}/2$ and the midpoint. In this way, three zones 22a, 22b and 22c within the range 18 may be defined where 22a is the range between $+V_{ref}$ and $V_h$, 22b is the range between $V_h$ and $V_1$ and 22c is the range between $V_1$ and $-V_{ref}$.

The gain stage 10 will treat $V_{in}$ differently depending on range 22a through 22c into which it falls to produce different values of $V_{out}$ and $O_1$ and $O_0$. In range 22a, $V_{out}$ will equal two times $V_{in}$ minus $V_{ref}$ and $O_1$ will equal one and $O_0$ will be zero. Similarly for the range 22b, the $V_{out}$ will equal two times $V_{in}$ and $O_1$ will equal zero and $O_0$ will be one. Finally for range 22c, $V_{out}$ will equal two times $V_{in}$ plus $V_{ref}$ and $O_1$ will equal zero while $O_0$ will equal zero.

Figure 2:
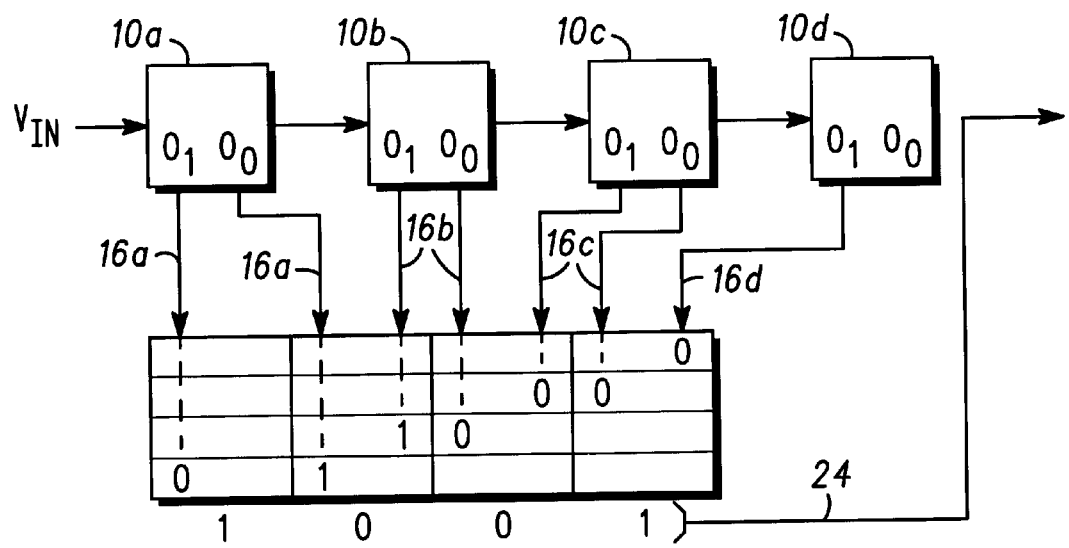
FIG. 2 is a prior art block diagram showing an ADC formed of cascaded gain stages of FIG. 1 and showing the combination of output values from each gain stage to produce an output digital value.

Referring now to FIG. 2, a set of gain stages 10a through 10d may be assembled, for example, to produce a pipelined ADC 11 providing a conversion of four bits. Each of the gain stages 10a–d is connected in series so that $V_{in}$ is received by gain stage 10a whose $V_{out}$ is received as $V_{in}$ for gain stage 10b and so forth. The conversion bits 16a through 16d of each gain stage 10, respectively, are assembled through addition to create the output digital value 24 as follows: $O_1$ of output stage 10d is added to $O_0$ of output stage 10c to create the least significant bit of the output digital value 24. $O_1$ of output stage 10c is added to $O_0$ of output stage 10b plus any amount carried from the previous addition for the least significant bit to create the next significant bit of the output digital value 24. Output $O_1$ from gain stage 10b is added to output $O_0$ from gain stage 10a and added with any amount carried from the previous significant bit to create the next most significant bit of the output digital value 24. And finally, output $O_1$ is added to any bit carried from the previous addition to create the most significant bit of the output digital value 24.

Figure 3:
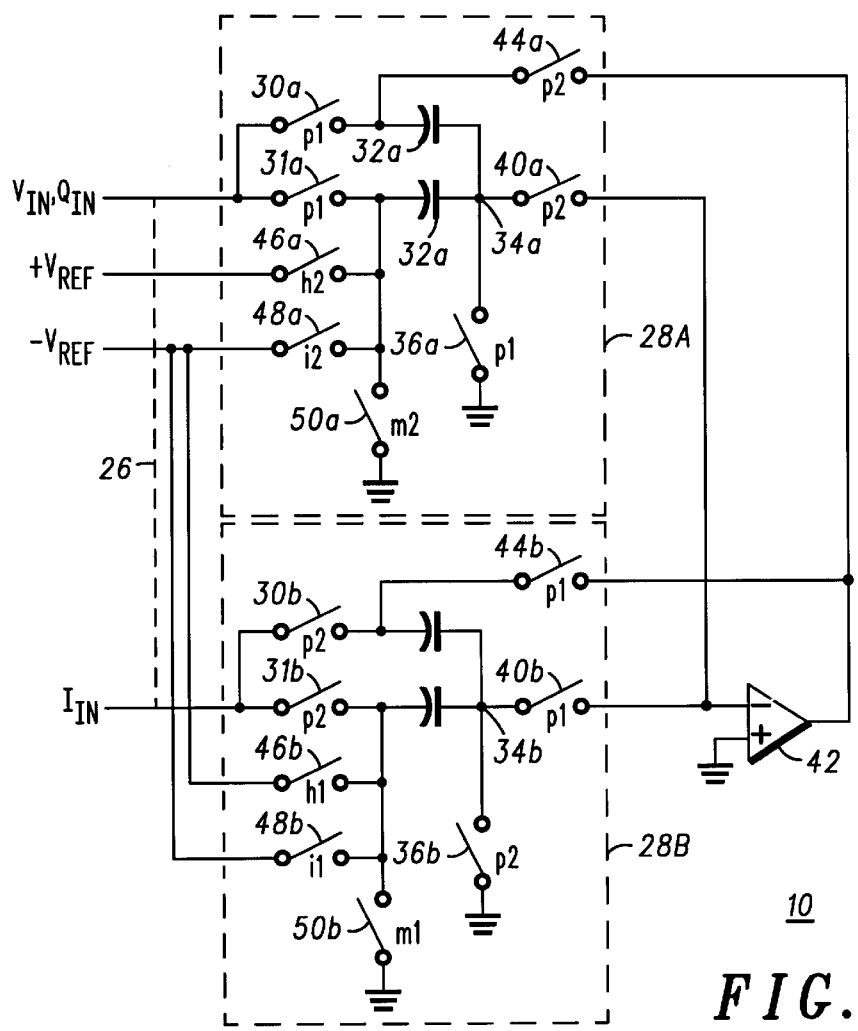
FIG. 3 is a schematic diagram of a prior art circuit implementing a dual phase gain stage of FIG. 1 with two sets of switched capacitors, as may be modified by removal of the conductor of the dotted line for use in the present invention to accept two separate alternate phase input signals for later stages of a pipelined ADC per the present invention.
Figure 4:
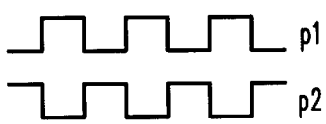
FIG. 4 is a graph plotting two phases of a clock signal against time, the clock signal suitable for activation of the two banks of switched capacitors of FIG. 3.

Referring now to FIG. 3 and 4, a prior art gain stage 10 for a single input $V_{in}$, sampling in two alternating clock phases (p1 and p2), employs two switched capacitor banks 28a and 28b connected via dotted line connection 26.

These two switched capacitor banks 28a and 28b will operate similarly, although during different phases of a clock signal, and hence it is sufficient to describe only one switched capacitor bank 28a in detail. The input $V_{in}$ is received by the switched capacitor banks 28a at a common terminal of two single-pole, single-throw switches 30a and 31a operating to close when clock signal p1 is high Switches 30a and 31a, as the other switches to be described, are all single-pole, single-throw switches and may be implemented by a complementary transistor pair of a type well known in the art to create a solid state switch. The clock signal that is high to close a given switch is shown by a notation (e.g. p1) next to the switch The downstream terminals of switches 30a and 31a connect to corresponding capacitors 32a which have their remaining terminals joined at location 34a to one terminal of a switch 36a and also to one terminal of the switch 40a. The remaining terminal of switch 36a connects to ground. Switch 36a is closed when signal p1 is high Conversely, the remaining terminal of switch 40 is connected to the inverting input of an operational amplifier 42 and is closed when a signal p2 is high Connected to the junction between switch 30a and capacitor 32a is one terminal of switch 44a. Switch 44a is closed when signal p2 is high, and has its remaining terminal connected to the output of the operational amplifier 42. The junction between switch 31a and its capacitor 32a is connected to one pole of three switches 46a, 48a and 50a. The remaining terminal of switch 46a connects to $+V_{ref}$, the remaining terminal of switch 48a connects to $-V_{ref}$ and the remaining terminal of switch 50a connects to ground. Switch 46a closes when a signal h2 is high (h2 is in phase but not identical with p2). Switch 48a closes when a signal i2 is high (i2 is in phase with p2 but not identical with p2) and switch 50a closes when a signal m2 is high (m2 is in phase with p2 but not identical with p2). Generally, when p2 is high, only one of h2, i2, and m2 will be high as dictated by the value of $V_{in}$ per the rules described above with respect to FIG. 1 and as determined by range comparison circuitry (not shown).

Figure 5:
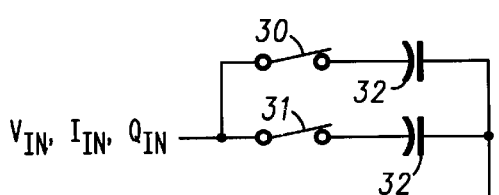
FIG. 5 is a simplified depiction of one bank of switched capacitors of FIG. 3 during a first clock phase showing connection of capacitors in parallel for receiving an input signal.

Referring now to FIG. 5, during a first phase of operation of the gain stage 10, when p1 is high and p2 is low, switches 30a, 31a, and 36a will be closed and switches 40a, 44a, 46a, 48a and 50a will be open resulting in the equivalent circuit of FIG. 5 in which $V_{in}$ is connected simultaneously to the parallel connected capacitors 32a and the remaining common terminal of capacitors 32a is connected to ground. This will cause the charging of the capacitor 32a to the voltage of $V_{in}$.

Figure 6:
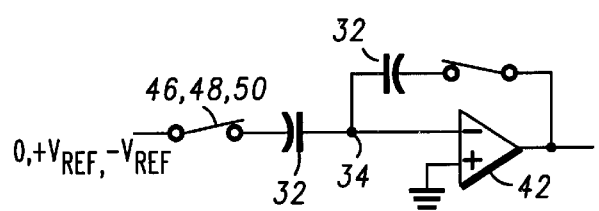
FIG. 6 is a figure similar to that of FIG. 5 showing connections of the capacitors during a second clock phase across an amplifier.

At a second phase of operation of the gain stage 10, when p2 is high and p1 is low, the circuit will revert to the configuration of FIG. 6 in which switches 30a, 31a and 36a are open and switches 40a, 44a, are closed and one of switches 46a, 48a or 50a are closed connecting capacitor 32a to one of $+V_{ref}$, $-V_{ref}$ or zero per the logic described with respect to FIG. 1. The closing of switches 40a and 44a connects the common point 34a between capacitors 32a to the inverting input of the operational amplifier 42 and connecting the remaining terminal of first capacitor 32a to the output of the operational amplifier and connects the remaining terminal of second capacitor 32a to one of $V_{ref}$, $-V_{ref}$ or zero depending on which of switches 46a, 48a or 50a are closed.

In the situation where m2 alone is closed, the charge on the second capacitors 32a is transferred to capacitor 32a, the latter closing the feedback loop from the inverting input to the output of the operational amplifier 42. If capacitors 32a are equal in value per the embodiment of the present invention for use in an ADC, this will create an output on the operation amplifier twice the voltage of $V_{in}$. When either of switches 46a or 48a are closed and switch 50a is open, the output of the operational amplifier will be modified by the addition or subtraction of $V_{ref}$ thus effecting the logic described above with respect to FIG. 1.

Referring again to FIG. 4, the switched capacitor bank 28b is essentially identical to switched capacitor bank 28a with the exception that the switches 30b, 31b, 36b, 40b, 44b, 46b, 48b, and 50b switch in opposite phase to switches 30a, 31a, 36a, 40a, 44a, 46a, 48a, and 50a to which they otherwise correspond. By this is meant that switches of switched capacitor bank 28a close when p2, while in switched capacitor bank 28b, they close when p1 is high, and vice versa. Thus the switched capacitor bank 28b assumes the configurations of FIGS. 5 and 6 in the opposite sequence of the switched capacitor banks 28a allowing for the processing of two interleaved samples of $V_{in}$ as is known.

Using the circuit of FIG. 3, $V_{in}$ could be broken up so that switched capacitor bank 28a receives the value of $I_{in}$, while switched capacitor bank 28b receives a value of $Q_{in}$ independent of $I_{in}$. In this manner, dual I and Q inputs could be accommodated by the circuit of FIG. 3 with the provision that the sampling of the inputs is staggered and out of phase. The present invention, in fact, avoids this staggering of sampling times which causes errors in many applications in which dual input ADCs are required, but uses a version related to the circuit of FIG. 3 in later stages of the pipelined where the $I_{in}$ and $Q_{in}$ inputs are separated.

Figure 7A:
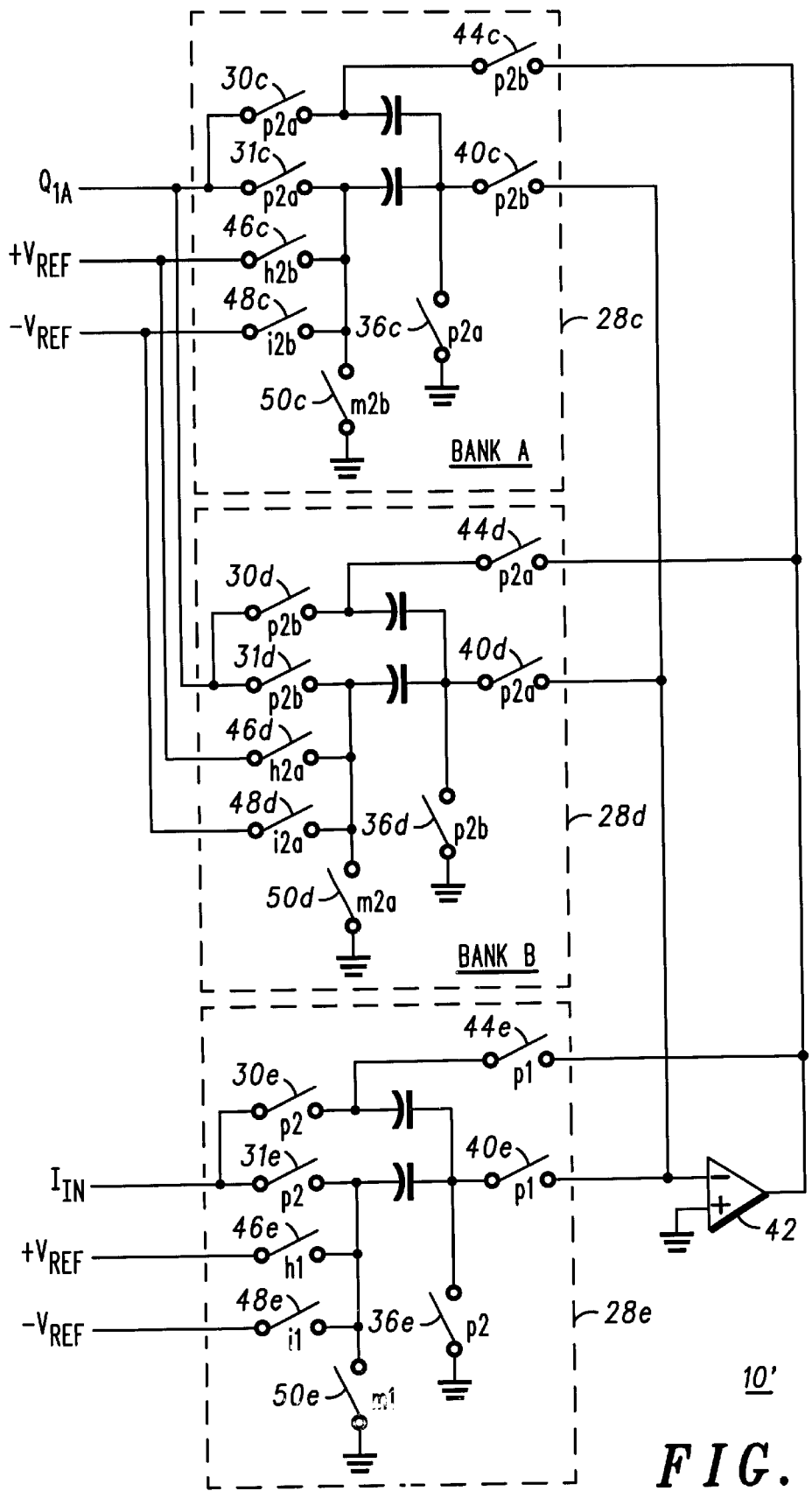
FIG. 7a is a schematic diagram similar to FIG. 3 showing a gain stage in accordance with the present invention having three banks of switched capacitors allowing simultaneous sampling of dual input signals.

Referring now to FIG. 7a, a gain stage 10' of the present invention provides for three switched capacitor banks: Switched capacitor bank 28c, (termed "Bank A"), switched capacitor bank 28d (termed "Bank B") and switched capacitor banks 28e. Switched capacitor bank 28c (Bank A) and switched capacitor bank 28d (Bank B) both receive the input voltage $Q_{in}$ while switched capacitor bank 28e receives the input voltage $I_{in}$. Generally each of the switched capacitor banks 28c, 28d, and 28e are of similar construction as those described above with, for example, like-numbered switches 30c, 31c, 32c, 40c, 44c, 46c, 48c and 50c for switched capacitor banks 28c, operating similarly to their above described counterparts. The timing of the activation of the switches of these switched capacitor banks 28c, and 28d, and 28e, however, differs from the timing of operation of switched capacitor banks 28a and 28b of FIG. 3, however, as will now be described.

Referring to FIGS. 7a and 8, for the gain stage 10', the signals p1 and p2 are augmented with signal p2a having half the frequency of signal p2 and having a high state and pulse width commensurate with every other pulse of signal p2. Also used is a signal p2b identical to signal p2a but for being out of phase by 180°, that is aligned with the pulses of signal p2 not aligned with signal p2a.

The switches of switched capacitor banks 28c and 28d are controlled by the signals p2a and p2b as follows. Switches 30c, 31c and 36c are closed when signal p2a is high whereas switches 40c, 44c, 46c, (and selectively one of switches 46c, 48c and 50c) are closed when signal p2b is high. This phase situation is reversed with switched capacitor banks 28d where switches 30d, 31d and 36d are closed when signal p2b is high whereas switches 40d, 44d, 46d, (and selectively one of switches 46d, 48d and 50d) are closed when signal p2b is high Switched capacitor bank 28e, in contrast, operates identically to switched capacitor bank 28b described above, with switches 30e, 31e and 36e closed when signal p2 is high whereas switches 40e, 44e, 46e, (and selectively switches 46e, 48e and 50e) are closed when signal p1 is high.

Referring now also to FIG. 10, it will be understood that with this phase relationship during a first time t0 (when p1, p2 and p2a are high), $I_{in}$ and $Q_{in}$ are sampled: $I_{in}$ through switched capacitor bank 28e and $Q_{in}$ through Bank A of switched capacitor bank 28c. At the same time, a previously stored value of $Q_{in}$ held on Bank B will be output by amplifier 42.

The subsequent time t1 when p1 is high (and p2, p2a, and p2b are low), the output $I_{in}$ previously captured on the capacitors of switched capacitor bank 28e is output.

At time t2, (when p1, p2 and p2b are high) the values $I_{in}$ and $Q_{in}$ are again sampled, $Q_{in}$ through Bank B of switched capacitor bank 28d whereas the output receives the previously sampled value of $Q_{in}$ through the switched capacitor bank 28c of Bank A.

At time t3, $I_{in}$ is again output.

Referring now to FIGS. 10, 7a and 7b, the output of $I_{in}$ is processed at times $t_1$ and $t_3$ immediately after its sampling at times $t_0$ and $t_1$ and thus the values for $h_1$, $l_1$, and $m_1$ (obtained immediately after the samplings) as processed by range comparison circuitry 66 (shown in FIG. 7b) can be passed directly to switches 31e, 46e and 50e. In contrast, however, the output of $Q_{in}$ are processed at times $t_0$ and $t_2$ an additional delay period after its sampling at times $t_{-2}$ and $t_0$ and thus the values for $h_{2a}$, $l_{2a}$, and $m_{2a}$ and $h_{2b}$, $l_{2b}$, and $m_{2b}$ (obtained immediately after the sampling) as determined by range comparison circuitry 62 must be delayed. This delay is obtained by the introduction of a D-type flip flop 64 in the signal path between the range comparison circuitry 62 and the switched capacitor banks 28c and 28d.

Referring to FIG. 8, even though the value of $Q_{in}$ passes alternately between two Banks A or B, it can be seen that outputs of $I_{in}$ and $Q_{in}$ are interlaced and that a complete sampling occurs every clock phase of p2. The values of I and Q are simultaneously sampled eliminating the drawbacks to the use of the circuitry of FIG. 3 for a dual input ADC. Further, although the value of $Q_{in}$ passes alternately through Bank A and Bank B, for any given sample, no additional circuitry is interposed between the input $Q_{in}$ and the amplifier 42 such as may add noise or offset.

Referring now to FIG. 11, an ADC 11 making use of the present invention may use an initial gain stage 10' according to the embodiment of FIG. 7a of the present invention followed by a number of gain stages 10 according to the embodiment of FIG. 3. In the first stage, $I_{in}$ and $Q_{in}$ are simultaneously sampled but output in alternating fashion. In this way, the later stages may be simplified per the embodiment of FIG. 3. Thus the additional circuitry of FIG. 7a is required only for the initial gain stage of an ADC 11' reducing further the overall burden of circuitry over, for example, the use of completely separate ADCs.

Referring now to FIG. 9, the present invention may be implemented in a differential configuration by duplicating the circuitry 10' in two different blocks each of which provides input to a differential amplifier 50. Differential operation may be used to reduce common mode noise or the like.

Further it will be understood that the operation of the circuitry of the present invention may be operated with single ended power supplies simply by referencing each of the previously described voltages to a midpoint of the power supply range and ensuring that $V_{in}$ remains between the power supply rails of the operational amplifier.

It is specifically intended that the present invention not be limited to the embodiments and illustrations contained herein, but that modified forms of those embodiments including portions of the embodiments and combinations of elements of different embodiments also be included as come within the scope of the following claims.

We claim:

1. A switched capacitor gain stage having a first and second input and an output, the switched capacitor gain stage comprising:
   (a) an amplifier having an output connected to the output of the gain stage;
   (b) a first capacitor pair;
   (c) a second capacitor pair;
   (d) a third capacitor pair;
   (e) a switch network operating to:
       (i) at a first time, switch the first capacitor pair and the second capacitor pair to receive varying voltages from the first and second inputs, respectively, and switch the third capacitor pair across the amplifier and a reference voltage to provide an amplifier output voltage equal to a gain factor times a voltage previously received on the third capacitor pair plus the reference voltage;
       (ii) at a second time after the first time switch the first capacitor pair across the amplifier and a reference voltage to provide an amplifier output voltage equal to a gain factor times the voltage previously received on the first capacitor pair plus the reference voltage; and
       (iii) at a third time after the second time switch the first capacitor pair and the third capacitor pair to receive varying voltages from the first and second inputs, respectively, and switch the second capacitor pair across the amplifier and a reference voltage to provide an amplifier output voltage equal to a gain factor times the voltage previously received on the second capacitor pair plus the reference voltage;
   whereby the first and second inputs are sampled simultaneously and output sequentially.

2. The switched capacitor gain stage of claim 1 wherein each of the first, second, and third capacitor pairs include common first capacitor terminals and two independent second capacitor terminals and wherein each of the capacitor pairs receive the varying voltage from its respective input by means of the switch network connecting the independent second capacitor terminals to the respective input and the common first capacitor terminals to a ground.

3. The switched capacitor gain stage of claim 2 wherein each of the first, second and third capacitor pairs connect across the amplifier by means of the switch network connecting a first of the independent second capacitor terminals to the output of the amplifier and the second of the independent second capacitor terminals of the reference voltage and the common first capacitor terminals to an inverting input of the amplifier.

4. The switched capacitor gain stage of claim 1 wherein the reference voltage varies between a positive reference value, zero and a negative reference value depending on the voltage received by the respective capacitor pair.

5. The switched capacitor gain stage of claim 1 wherein the switch network further operates to repeat the connections of (e)(i)–(iii) after a plurality of periodic first times.

6. The switched capacitor gain stage of claim 1 wherein the first, second and third capacitor pairs are matched capacitors on a single integrated circuit.

7. A pipelinedd dual input analog to digital converter (ADC) including a plurality of series coupled switched capacitor gain stages, wherein a first of the switched capacitor gain stages includes dual inputs and three switched capacitor pairs and alternates simultaneous independent sampling of the dual inputs with the first and second capacitor pair and the first and third capacitor pair for most significant bit extraction and sequentially outputs to later stages a first output using the first capacitor pair, a second output using the second capacitor pair, a third output using the first capacitor pair and a fourth output using the third capacitor pairs.

8. The pipelined dual input ADC of claim 7 wherein the first and second outputs are based on a first of the dual inputs and the third and fourth outputs are based on a second of the dual input.

9. The pipelined dual input ADC of claim 7 wherein the outputs are equal to the corresponding of the inputs times two plus a reference voltage selected from the group consisting of zero, a positive preselected constant and a negative preselected constant.

10. The pipelined dual input ADC of claim 7 wherein the switched capacitor gain stages subsequent to the first switched capacitor gain stage have two switched capacitor pairs and alternate sequential sampling of the input with the first and second capacitor pairs to sequentially output a first output from the first capacitor pair and a second output from the second capacitor pair.

11. The pipelined dual input ADC of claim 7 wherein the most significant bit extraction controls the first, second, third, and fourth outputs to the later stages via control signals and wherein the control signals for the second and fourth outputs are delayed by a flip flop by one sampling period with respect to the control signals for the first and third outputs.

12. A method of operating a switched capacitor gain stage having a first and second input and an output, an amplifier having an output connected to the output of the gain stage; and a first, second and third capacitor pair and switches allowing connection of the capacitor pairs to the inputs, output and amplifier, the method comprising the steps of;
    (a) at a first time, switch the first capacitor pair and the second capacitor pair to receive varying voltages from the first and second inputs, respectively, and switch the third capacitor pair across the amplifier and a reference voltage to provide an amplifier output voltage equal to a gain factor times a voltage previously received on the third capacitor pair plus the reference voltage;
    (b) at a second time after the first time switch the first capacitor pair across the amplifier and a reference voltage to provide an amplifier output voltage equal to a gain factor times the voltage previously received on the first capacitor pair plus the reference voltage; and
    (c) at a third time after the second time switch the first capacitor pair and the third capacitor pair to receive varying voltages from the first and second inputs, respectively, and switch the second capacitor pair across the amplifier and a reference voltage to provide an amplifier output voltage equal to a gain factor times the voltage previously received on the second capacitor pair plus the reference voltage;
    whereby the first and second inputs are sampled simultaneously and output sequentially.

13. The method of claim 12 wherein each of the first, second, and third capacitor pairs include common first capacitor terminals and two independent second capacitor terminals and wherein each of the capacitor pairs receives the varying voltage from its respective input by the step of connecting the independent second capacitor terminals to the respective input and the common first capacitor terminals to a ground.

14. The method of claim 13 wherein each of the first, second and third capacitor pairs is connected across the amplifier by the steps of connecting a first of the independent second capacitor terminals to the output of the amplifier and the second of the independent second capacitor terminals of the a reference voltage and the common first capacitor terminals to an inverting input of the amplifier.

15. The method of claim 12 including the step of varying the reference voltage between a positive reference value, zero and a negative reference value depending on the voltage received by the respective capacitor pair.

16. The method of claim 12 including the repeating of steps (a)–(c) after a plurality of periodic first times.

17. The method of claim 12 including the step of matching the first, second and third capacitor pairs from capacitors on a single integrated circuit.

18. A method of operating a pipelined dual input analog to digital converter (ADC) including a plurality of series coupled switched capacitor gain stages, wherein a first of the switched capacitor gain stages includes dual inputs and three switched capacitor pairs, the method comprising the steps of:
    (a) alternating simultaneous independent sampling of the dual inputs with the first and second capacitor pair and the first and third capacitor pair; and
    (b) concurrently with step (a) sequentially outputting a first output using the first capacitor pair, a second output using the second capacitor pair, a third output using the first capacitor pair and a fourth output using the third capacitor pairs.

19. The method of claim 18 including the steps of deriving the first and second outputs from a first of the dual inputs and the second and fourth outputs from a second of the dual inputs.

20. The method of claim 18 wherein the outputs are equal to the corresponding of the inputs times two plus a reference voltage selected from the group consisting of zero, a positive preselected constant and a negative preselected constant.

21. The method of claim 18 wherein the switched capacitor gain stages subsequent to the first switched capacitor gain stage have two switched capacitor pairs and including the step of alternating sequential sampling of the input with the first and second capacitor pairs to sequentially output a first output from the first capacitor pair and a second output from the second capacitor pair.

22. The method of claim 18 wherein the most significant bit extraction controls the first, second, third, and fourth outputs to the later stages via control signals and wherein the control signals for the second and fourth outputs are delayed by a flip-flop by one sampling period with respect to the control signals for the first and third outputs.

* * * * *